(12) United States Patent
Shamouilian et al.

(10) Patent No.: US 6,440,221 B2
(45) Date of Patent: *Aug. 27, 2002

(54) PROCESS CHAMBER HAVING IMPROVED TEMPERATURE CONTROL

(75) Inventors: Shamouil Shamouilian, San Jose; Ananda H. Kumar, Fremont; Kadthala R. Narendrnath, San Jose; Eric Farahmand E Askarinam, Sunnyvale; Edwin C. Weldon, Los Gatos; Michael Rice, Pleasanton; Kenneth S. Collins, San Jose, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/082,430

(22) Filed: May 20, 1998

Related U.S. Application Data

(63) Continuation-in-part of application No. 08/893,393, filed on Jul. 15, 1997, now Pat. No. 6,074,512, which is a continuation-in-part of application No. 08/733,555, filed on Oct. 21, 1996, now Pat. No. 6,063,233, which is a continuation-in-part of application No. 08/648,254, filed on May 13, 1996, now Pat. No. 6,165,311.

(51) Int. Cl.$^7$ .......................... C23C 16/00; C23C 14/34; C23F 1/02

(52) U.S. Cl. ................ 118/724; 118/723 I; 204/298.09; 156/345

(58) Field of Search ...................... 204/298.09; 118/724, 118/723 I; 156/345, 345 P, 345 C, 345 PH

(56) References Cited

U.S. PATENT DOCUMENTS

| 4,236,994 A | * 12/1980 | Degdale | 204/298 |
|---|---|---|---|
| 4,427,516 A | 1/1984 | Levinstein et al. | 204/192 E |
| 4,711,698 A | 12/1987 | Douglas | 156/643 |

(List continued on next page.)

FOREIGN PATENT DOCUMENTS

| EP | 0520519 A | 12/1992 | H01J/37/32 |
|---|---|---|---|
| EP | 0552490 A | 7/1993 | H01L/21/311 |
| EP | 0680072 A | 11/1995 | H01J/37/32 |
| EP | 0727807 A | 8/1996 | H01J/37/32 |
| EP | 0742577 A | 11/1996 | H01J/37/32 |
| JP | 6212129 A | 1/1987 | H01L/21/302 |
| WO | WO9220833 | 11/1992 | C23C/16/00 |

OTHER PUBLICATIONS

Coburn, W.J., "Increasing the Etch Rate Ratio of $SiO_2$/Si in Fluorocarbon Plasma Etching," *IBM Technical Disclosure*, vol. 19, No. 10, Mar. 1977.

(List continued on next page.)

Primary Examiner—Steven H. VerSteeg
(74) Attorney, Agent, or Firm—Janah and Associates; Joseph Bach

(57) ABSTRACT

A temperature control system 145 is used to control the temperature of a process chamber 25 during processing of a semiconductor substrate 70. The temperature control system 145 comprises a heat exchanger plate 155 for removing heat from the chamber 25, and a heat transfer member 158 for conducting heat to the heat exchanger plate 155. The heat transfer member 158 comprises a lower heat conduction surface 205 bonded to an external surface of the chamber 25, and an upper heat transmitting surface 210 thermally coupled to the heat exchanger plate 155. Preferably, the temperature control assembly comprises a heater 150 for heating the chamber 25, and a computer control system 165 for regulating the heat removed by the heat exchanger plate 155 as well as the heat supplied by the heater 150, to maintain the chamber 25 at substantially uniform temperatures.

40 Claims, 4 Drawing Sheets

U.S. PATENT DOCUMENTS

| | | | |
|---|---|---|---|
| 4,756,810 A | | 7/1988 | Lamont, Jr. et al. ...... 204/192.3 |
| 4,786,352 A | * | 11/1988 | Benzing ...................... 156/345 |
| 4,793,897 A | | 12/1988 | Dunfield et al. ............. 156/643 |
| 4,918,031 A | | 4/1990 | Flamm et al. ............... 437/225 |
| 4,948,458 A | | 8/1990 | Ogle ........................... 156/643 |
| 4,990,229 A | | 2/1991 | Campbell et al. ....... 204/298.06 |
| 5,000,113 A | | 3/1991 | Wang et al. ................. 118/723 |
| 5,074,456 A | | 12/1991 | Degner et al. ............... 228/121 |
| 5,160,545 A | * | 11/1992 | Maloney et al. ............ 118/725 |
| 5,187,454 A | | 2/1993 | Collins et al. .............. 333/17.3 |
| 5,203,956 A | | 4/1993 | Hansen et al. .............. 156/643 |
| 5,241,245 A | | 8/1993 | Barnes et al. ........... 315/111.41 |
| 5,277,751 A | | 1/1994 | Ogle ........................... 156/643 |
| 5,349,313 A | | 9/1994 | Collins et al. .............. 333/131 |
| 5,392,018 A | | 2/1995 | Collins et al. .............. 336/155 |
| 5,401,350 A | | 3/1995 | Patrick et al. .............. 156/345 |
| 5,556,501 A | | 9/1996 | Collins et al. .............. 156/345 |
| 5,595,606 A | * | 1/1997 | Fujikawa et al. ........... 118/725 |
| 5,766,498 A | * | 6/1998 | Koijma et al. ................ 216/71 |
| 5,948,283 A | * | 9/1999 | Grosshart ..................... 216/67 |
| 6,015,761 A | * | 1/2000 | Merry et al. ................. 438/727 |
| 6,074,512 A | * | 6/2000 | Collins et al. .............. 156/345 |

OTHER PUBLICATIONS

Matsuo, S., "Selective Etching of $SiO_2$ Relative to Si by Plasma Reactive Sputter Etching," *J. Vac. Sci. Tech.*, vol. 17, No. 2, Mar.–Apr. 1980.

European Patent Office Communications pursuant to Article 96(2) and Rule 51(2) EPC for Application No. 94307307.2–2208, mailed Jan. 17, 1996.

*Patent Abstracts of Japan*, vol. 096, No. 002, Feb. 29, 1996 and JP 07 288196 A (Tokyo Electron Ltd), Oct. 31, 1995.

*Patent Abstracts of Japan*, vol. 018, No. 545 (E–1617), Oct. 18, 1994 and JP 06 196446 A (NEC Corp), Jul. 15, 1994.

*Patent Abstracts of Japan*, vol. 096, No. 005, May 31, 1996 and JP 08 017799 A (Plasma SYST:KK), Jan. 19, 1996.

* cited by examiner

PROCESS CHAMBER HAVING IMPROVED TEMPERATURE CONTROL

CROSS-REFERENCE

This application is a continuation-in-part of U.S. patent application Ser. No. 08/893,393, filed on Jul. 15, 1997 now U.S. Pat. No. 6,074,512, entitled "Inductively Coupled RF Plasma Reactor Having an Overhead Solenoidal Antenna and Modular Confinement Magnet Liners," which is a continuation-in-part of U.S. patent application Ser. No. 08/733,555 filed Oct. 21, 1996 now U.S. Pat. No. 6,063,233, entitled "Thermal Control Apparatus for Inductively Coupled RF Plasma Reactor Having an Overhead Solenoidal Antenna," which is a continuation-in-part of U.S. patent application Ser. No. 08/648,254, filed May 13, 1996 now U.S. Pat. No. 6,165,311, entitled "Inductively Coupled RF Plasma Reactor Having an Overhead Solenoidal Antenna," all of which are incorporated herein by reference.

BACKGROUND

The present invention relates to a process chamber for processing semiconductor substrates.

Control of the temperature of process chambers that are used to etch, implant, or deposit material on semiconductor substrates, is necessary to provide reliable and reproducible semiconductor fabrication processes. Many of these processes are highly temperature dependent and provide different processing rates or characteristics at different temperatures. Temperature fluctuations of a chamber are particularly undesirable during sequential processing of a batch of substrates, because the substrates are processed with different properties. For example, in etching processes, temperature fluctuations can cause the shape of the etched features on the substrate to vary widely from one substrate to another, and to vary as a function of the temperature profile across the substrate. Also, large temperature fluctuations of the chamber components or walls can cause residues that deposit on the chamber walls or ceiling to flake off and contaminate the substrate.

Another temperature control problem arises when the chamber walls and surfaces are made of ceramic materials, such as silicon, $B_4C$ or BN. Some ceramic materials have a low thermal shock resistance and crack when subjected to thermal stresses resulting from large variations in temperature across the ceramic component. For example, a chamber wall is made from a ceramic material, such as aluminum oxide which has a low tolerance to thermal stress, when inductor coils are used to couple RF energy into the chamber. Also, other ceramic materials that have high thermal expansion coefficients undergo a large expansion or contraction for even a small temperature change causing the wall to break or crack when subjected to widely different temperatures. It is desirable to control the temperature of the ceramic surfaces of process chambers and to reduce their temperature fluctuations.

Conventional temperature control systems for semiconductor process chambers include "water-jacket" liquid-recirculating systems or forced-air cooling systems. However, in many process chambers, complex shaped components, such as inductor coils, which are positioned next to the chamber surfaces make it difficult to transfer heat to and from the chamber surfaces in the gaps or narrow spaces between these components. In addition, liquid recirculating systems typically circulate water through a large number of channels that have small diameters, providing a bulky system that is difficult to attach or couple to the chamber without forming contact areas of high thermal resistance. Also, the channels and circulating liquid absorb RF induction energy and cannot be used near inductor components that transmit RF energy into the chamber. In addition, inadequate arrangement of the channels of the recirculating system often result in instabilities and localized hot spots around the components on the chamber.

Forced-air cooling systems, as for example, described in U.S. Pat. No. 5,160,545, issued Nov. 3, 1992, use fans to blow cooled air past chamber surfaces. These systems often cause localized hot spots at portions of the chamber that are shielded from the air flow. Also, because the primary mode of heat transfer is conduction by air, forced air cooling systems typically require an extremely large air flow to achieve even a moderately acceptable response time to large temperature fluctuations in the chamber, such as the temperature fluctuations caused by turning on and off the plasma or other heat loads in the chamber. The large air flow rates also typically require large fans, which are more prone to mechanical failure, and upon failure, can severely damage chamber components.

Thus it is desirable to have a process chamber having a temperature control system capable of providing uniform temperatures and reducing large temperature fluctuations in process chambers. It is further desirable for the temperature control system to control temperatures during widely varying thermal loads. It is also desirable to have a temperature control system that does not interfere with the operation of electrical chamber components, and in particular, does not dissipate or attenuate inductively coupled RF energy. It is further desirable for the temperature control system to reduce or eliminate thermal stresses on the chamber surfaces, particularly the ceramic surfaces.

SUMMARY

The present invention relates to a process chamber providing improved temperature control during processing of a semiconductor substrate in the chamber. The process chamber comprises a support, a process gas distributor, a heat transfer member having a heat conduction surface bonded to an external surface of the process chamber, and an exhaust. The substrate is held on the support in the process chamber. Process gas is introduced into the process chamber, and optionally, RF energy is coupled to the process gas to sustain a plasma of the process gas. The process gas or plasma is used to process the substrate, and thereafter is exhausted by the exhaust. A flow of heat to and from the process chamber is regulated via the heat transfer member that is bonded to the external surface of the process chamber. Preferably, the heat transfer member comprises a heat conduction surface having an RMS peak-to-peak roughness of less than about 500 microns.

In a preferred version, the process chamber further comprises a ceiling comprising semiconductor material having an electrical susceptibility that is sufficiently low to allow an RF induction field to permeate therethrough, and an inductor antenna adjacent to the ceiling to couple an RF induction field through the ceiling into the process chamber. A temperature control system that is capable of maintaining substantially uniform temperatures across the ceiling, comprises a heat exchanger and a heat transfer member having a heat conduction surface bonded to the ceiling and a heat transmitting surface thermally coupled to the heat exchanger.

In another aspect, the present invention further comprises a method of processing a substrate in a process chamber. The method comprises the steps of placing a substrate in the process chamber, introducing process gas into the process chamber, charging an inductor antenna adjacent to a ceiling of the process chamber to couple RF energy to the process gas to sustain a plasma in the process chamber, and monitoring the temperature of the ceiling and regulating the flow of heat to and from the process chamber via a heat transfer member bonded to the ceiling, a heater, and a heat exchanger.

In yet another aspect, the present invention further comprises a method of bonding a heat transfer member to an external surface of a process chamber. The method comprises the steps of forming a heat transfer member having a heat conduction surface, providing a thermally conducting adhesive between the heat transfer member and the external surface, pressing the heat transfer member against the external surface, and heating the thermally conducting adhesive to cure the adhesive and form a thermally conducting bond between the heat transfer member and the external surface of the process chamber.

DRAWINGS

These and other features, aspects, and advantages of the present invention will become better understood with regard to the following description, appended claims, and accompanying drawings which illustrate examples of preferred embodiments of the invention, where:

DESCRIPTION

Figure 1:
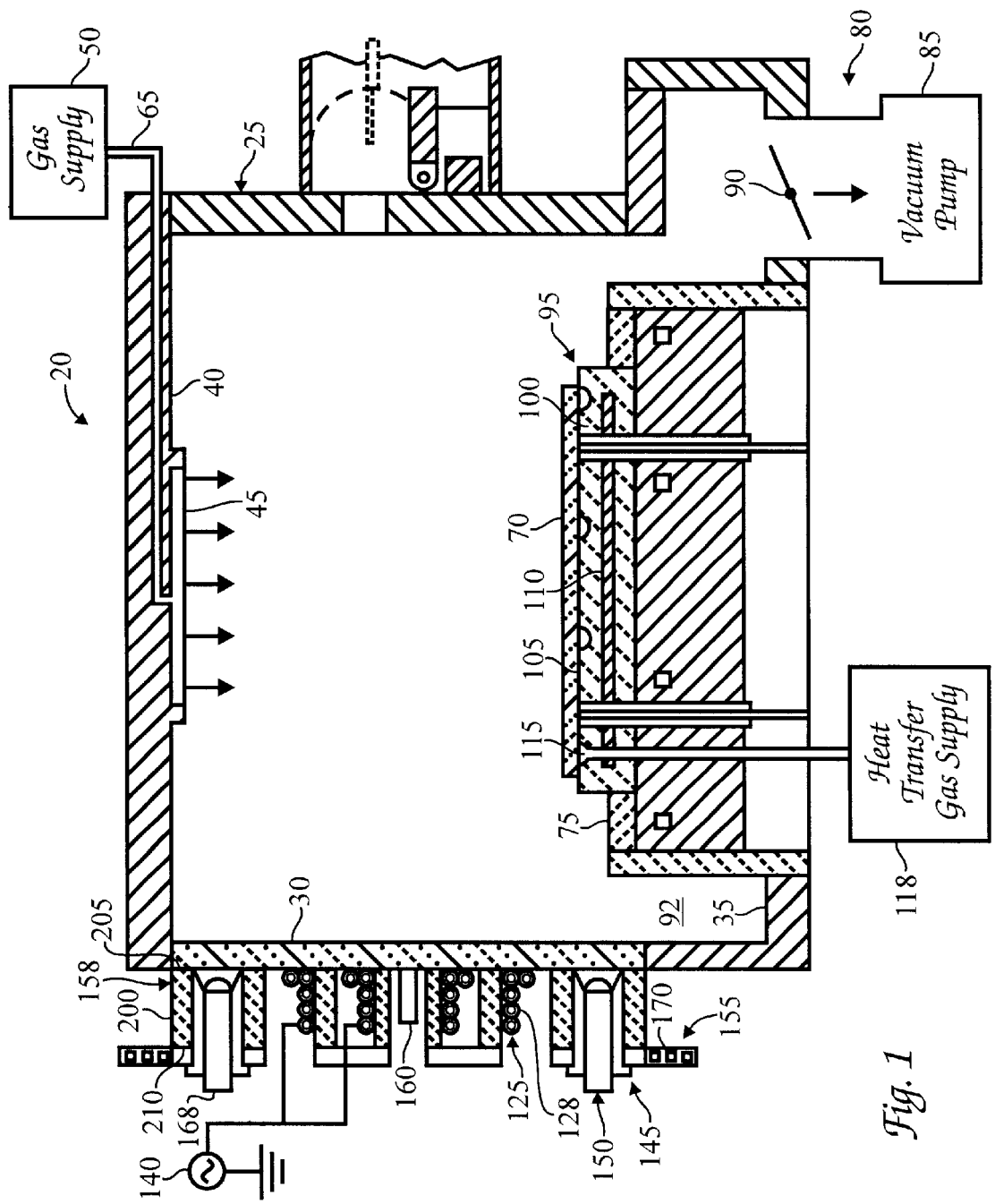
FIG. 1 is a schematic sectional side view of a process chamber of the present invention showing a temperature control system along a wall of the chamber.

An exemplary processing apparatus 20 of the present invention, as schematically illustrated in FIG. 1, generally comprises a process chamber 25 having sidewalls 30, a bottom wall 35, and a ceiling 40. The chamber 25 is fabricated from metals, ceramics, glasses, polymers, or composite materials. Metals commonly used to fabricate the process chamber 25 include, for example, anodized aluminum, stainless steel, or INCONEL™, of which anodized aluminum is preferred. Ceramic and semiconductor materials used to fabricate the chamber 25 include, for example, silicon, boron carbide, quartz, or aluminum oxide. The processing apparatus 20 is provided only to illustrate the present invention, and should not be used to limit the scope of the invention.

Figure 2:
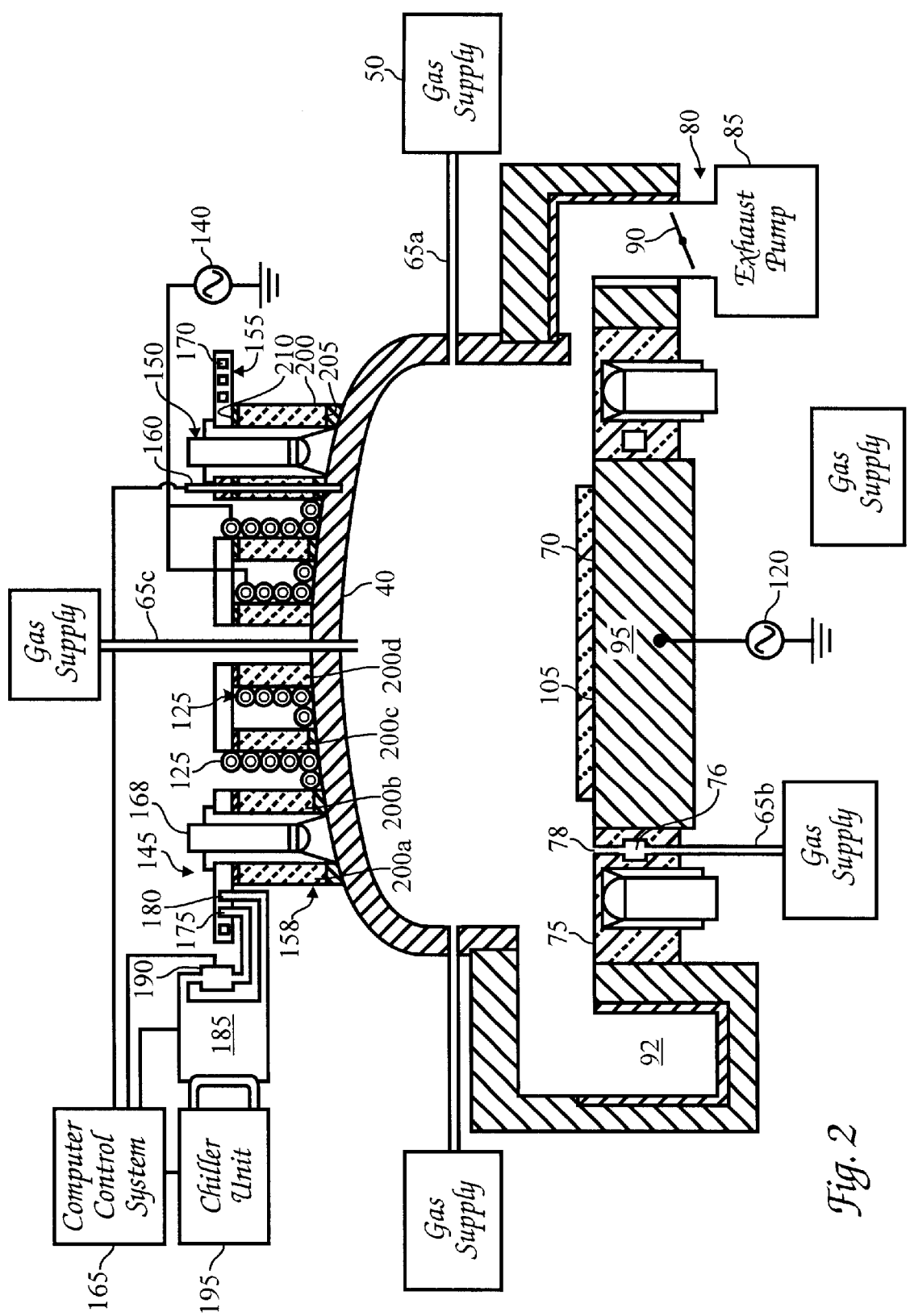
FIG. 2 is a schematic sectional side view of another embodiment of the process chamber of the present invention showing the temperature control system for a dome shaped ceiling.

Process gas is introduced into the chamber 25 through a process gas distribution system that includes a gas distributor 45, a process gas supply 50 and gas feed conduits 65. Referring to FIG. 2, the gas feed conduits 65a can extend through the sidewalls 30 to end near a peripheral edge of a substrate 70, or the gas feed conduits 65b can be positioned to extend upwardly through the bottom wall 35 and towards the periphery of the substrate 70, or the gas feed conduits 65c can extend downward through the center of the ceiling 40. In one embodiment, the gas feed conduits 65b extend through a heated silicon ring 75 that surrounds the substrate 70 and that has a circular passageway 76 for holding process gas and an array of gas injection holes 78 to distribute the process gas around the periphery of the substrate 70. An exhaust system 80 comprising one or more exhaust pumps 85 (typically including a 1000 liter/sec roughing pump), and a throttle valve 90 are used to exhaust spent process gas and control the pressure of process gas in the chamber 25. Preferably, an annulus 92 surrounding the lower portion of the chamber forms an asymmetric pumping channel that is used to pump gases out of the chamber 25 and to provide a uniform distribution of gaseous species around the surface of the substrate 70.

The process chamber 25 comprises a pedestal or support 95 at the bottom of the chamber for supporting the substrate 70. In one embodiment, a dielectric member 100 having a receiving surface 105 for receiving the substrate 70 is positioned on the support 95. An electrode 110 is embedded in the dielectric member 100 so that dielectric material completely surrounds the electrode 110. Preferably, the dielectric member 100 comprises a monolithic structure fabricated from a thermally fused polymer or ceramic, for example, aluminum oxide, aluminum nitride, silicon carbide, silicon nitride, or mixtures thereof. More preferably, the electrode 110 is fabricated from a conductive refractory metal having a high melting point, such as tungsten, tantalum, or molybdenum. As illustrated in FIG. 1, the dielectric member 100 can also comprise holes 115 extending therethrough for providing heat transfer gas, such as helium, to the receiving surface 105 below the substrate 70. Typically, a series of holes 115 is provided around the circumference of the dielectric member 100 to provide a uniform distribution of gas supplied by a heat transfer gas supply 118 to the region below the substrate 70.

In a preferred embodiment, the electrode 110 has dual functions, serving both as a plasma generator by capacitively coupling to an electrically biased or grounded surface of the chamber 25, and also as an electrode of an electrostatic chucking system that generates an electrostatic force for electrostatically holding the substrate 70. An electrode voltage supply 120 maintains an electrical potential between the electrode 110 and a surface of the chamber 25, such as the ceiling 40. Preferably, both a DC chucking voltage and an RF bias voltage is applied to the electrode 110 through an electrical connector. The RF bias voltage comprises one or more frequencies from 13.56 MHZ to 400 KHz at a power level of from about 50 to about 3000 Watts. The DC voltage is applied to the electrode 110 to generate an electrostatic charge that holds the substrate 70 to the electrostatic chucking system, the DC voltage being typically from about 250 to about 2000 volts.

Figure 3:
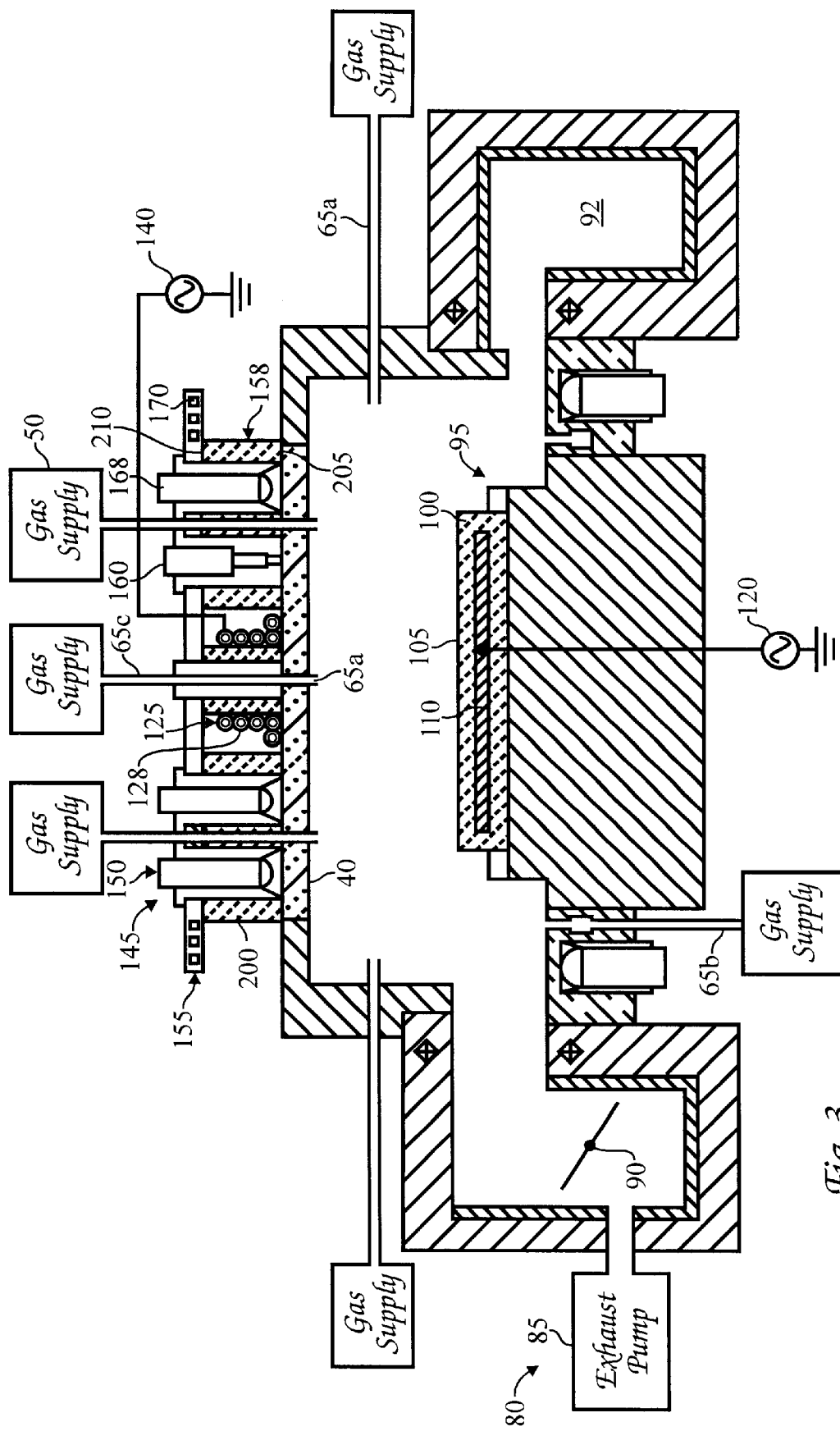
FIG. 3 is a schematic sectional side view of a temperature control system comprising heat transfer rings bonded to a ceiling of a process chamber.

The ceiling 40 of the process chamber 25 can be flat as shown in FIGS. 1 and 3, or dome-shaped as shown in FIG. 2. The dome-shaped hemispherical ceiling 40 serves as a window to the RF induction field transmitted by an inductor antenna 125 adjacent to the ceiling 40. Preferably, at least a portion of the ceiling 40 is made from materials permeable to RF, such as dielectric or semiconducting material, that has a low impedance to the RF induction field of the inductor antenna 125 or that have an electric field susceptibility that is sufficiently low to transmit the induction field generated by the inductor antenna 125 through the ceiling 40 with minimum loss of power. Preferably, the ceiling 40 is made from a semiconducting material that can be biased relative to the electrode 110 to allow it to capacitively couple RF energy to the plasma in the chamber 25. The semiconductor ceiling 40 is connected to an electrical potential, such as an RF power source, or to electrical ground. For example, in the apparatus shown in FIG. 2, a source power supply 140 is connected across the inductor antenna 125, and a bias power supply 120 is connected to the electrode 110 while the ceiling 40 is grounded. The semiconductor ceiling 40 can also be left unconnected and allowed to float electrically, in which case the plasma is formed solely by the RF power applied to the antenna 125 inductively coupled through the ceiling 40.

Many semiconducting and dielectric materials can be used to make the RF conducting ceiling 40 including silicon, silicon carbide, germanium, or Group III–V compound semiconductors such as gallium arsenide and indium phosphide; or Group II–III–V compound semiconductors such as mercurycadmium-telluride. In a preferred embodiment, the semiconductor ceiling 40 comprises a slab of semiconducting silicon having resistivity of less than about 500 Ω-cm (at room temperature), more preferably about 10 Ω-cm to about 300 Ω-cm, and most preferably about 20 Ω-cm to about 200 Ω-cm. Silicon is preferred since it is less likely to be a source of contamination for processing silicon substrates 70 in comparison with other materials such as $Al_2O_3$ or aluminum, which are typically employed to form the chamber ceiling 40. Also, silicon can serve as a scavenger for gaseous species in the chamber 25 such as fluorine. In addition, the all-semiconductor surfaces enclosing and defining a process zone need not be passivated by accumulated polymer deposits, but instead may be left bare during plasma processing. This is possible because interaction between the plasma and the semiconductor surfaces does not produce byproducts harmful to processing of the substrate 70, but instead produce volatile byproducts that are pumped away by the exhaust system 80. While the semiconductor ceiling 40 is illustrated as a monolithic structure, the ceiling 40 can also be formed from a plurality of tiles or segmented members. Instead of a semiconductor chamber wall 30 or ceiling 40, the chamber 25 can also comprise instead a dielectric or metal chamber wall 30 or ceiling 40 of any suitable shape including a planar, dome, conical, truncated conical, cylindrical, or combination of such shapes. For example, the ceiling 40 can comprise a dome or sidewall 30 composed of a dielectric material that is transparent to RF fields and is also an electrical insulator material, such as aluminum oxide.

The inductor antenna 125 is adjacent to the ceiling 40, which is transparent to RF energy, inductively couples RF energy into the chamber 25 to form a high density plasma therein. The inductor antenna 125 preferably comprises multiple coils 128, as shown in FIG. 3, having a circular symmetry with a central axis coincident with the longitudinal axis of the process chamber 25 and perpendicular to the plane of the substrate 70. The circular symmetry of the inductor coils 128 provide a spatial distribution of inductive electrical field vector components that have a null or minimum along the central axis of symmetry, which reduces the number of electrons over the center of the substrate 70, as described in U.S. patent application Ser. No. 08/648,254, which is incorporated herein by reference. Preferably, each coil 128 comprises from about 1 to about 10 turns, and more typically from about 2 to about 6 turns.

Temperature Control System & Assembly

In any of the chamber configurations described above, a temperature control system 145 comprising an assembly of components can be used to control the temperature of a surface of the process chamber 25, such as the ceiling 40. The temperature of the ceiling 40 can be maintained at a predefined temperature, or range of temperatures, selected to reduce polymeric etchant residue deposition, provide more uniform temperature gradients for substrate processing, and/or to maintain particular electrical properties in ceilings made from semiconducting materials. Although the temperature control system 145 will be illustrated in the context of controlling the temperature of a ceiling 40, it can also be used to control the temperature of any other wall or surface of the process chamber 25, such as the sidewall 30 of the chamber; and the invention should not be limited to the exemplary embodiments described herein.

A suitable temperature range for the sidewall 30 or ceiling 40 of a chamber 25 during processing of a substrate 70 in the chamber 25 depends upon many factors, including the process gas composition and the RF power coupled to the plasma in the chamber. For example, process gas compositions comprising a high flow rate of hydrocarbons, such as $C_4F_8$ or $CHF_3$, can cause excessive deposition of polymeric etchant residue which is reduced by maintaining the ceiling 40 at constant temperatures above the condensation temperature of the polymeric residue. However, with conventional temperature control systems, as numerous substrates 70 are processed over a period of time, the temperature of the ceiling 40 continues to rise. Additionally, when the plasma is turned off, conventional temperature control systems cause the temperature of the ceiling 40 to drop to extremely low temperatures. As a result of these temperature fluctuations, etch or deposition rates can vary from one wafer to another, and polymeric residue deposits, which can flake-off from the thermal stresses, accumulate on the ceiling 40, and/or the walls of the chamber 25.

In addition, in the embodiment in which the ceiling 40 is made of semiconducting material, it must be maintained in a range of temperatures in which the semiconductor material provides semiconducting properties. For example, for silicon this range is from about 100 K to about 600 K. At temperatures exceeding this range, silicon provides a conductance similar to that of metal; below this range, it behaves as a very low conductivity dielectric material. Thus active control of the temperature of the semiconductor ceiling 40 is preferred to allow it to function both as an induction field window and as an electrode. Also, active temperature control of the window also provides a consistent and stable plasma and good "cold start" conditions for the plasma.

These problems are substantially reduced by the temperature control system 145 of the present invention. The temperature control system 145 employs direct thermal contact or indirect thermal contact to provide the desired temperature control of the chamber surface. Generally, the temperature control system 145 comprises (i) one or more heaters 150 that provide 30 controllable sources of heat, (ii) a heat exchanger 155 that can remove (or provide) heat to the chamber surface, (iii) a heat transfer member 158 for conducting heat between the chamber surface and the heat exchanger 155, (iv) a temperature sensor 160, and (v) computer control system 165 for controlling all of these components. The heaters 150, heat exchanger 155, and/or heat sinks provide multiple control mechanisms that allow rapid responses to both upward and downward fluctuations in the temperature of the chamber surfaces. Moreover, the heat transfer member 158 rapidly transfers heat to and from the chamber surface and increases the available heat radiating surface area of the chamber surface.

A suitable heater 150 for providing a source of heat for the temperature control system 145 can comprise a conventional electrical resistive heater (not shown) that directs radiant energy onto the chamber ceiling 40. Preferably the heater 150 comprises a plurality of radiant heat lamps 168, such as tungsten halogen lamps distributed across the surface of the ceiling 40, to provide a uniform radiation per unit surface area across the ceiling. For improved heating efficiency, the whole interior surface of the upper chamber containing the heat lamps 168 is lined with a reflective material such as an aluminum layer. The large area irradiated by the heat lamps 168 provides greater temperature uniformity and faster and more responsive control over temperature fluctuations inside the chamber 25.

The heat exchanger 155 can be used to either remove or provide heat to the chamber 25. Conventional heat exchangers 155 include "water-jacket" liquid-recirculating systems or forced-air cooling systems. A suitable heat exchanger 155 comprises channels 170 or passages for flowing a heat transfer fluid therethrough. The heat exchanger 155 typically comprises a plate of aluminum or copper with cooling channels 170 therein, and an inlet 175 and outlet 180 to supply heat transfer fluid to the channels 170. A heat transfer fluid reservoir 185 supplies heat transfer fluid to the channels 170 to heat or cool the heat exchanger 155 as needed to maintain the chamber 25 at constant temperatures. The heat transfer fluid can be heated by an in-line heater 190, such as a coil wrapped around the inlet conduit, or can comprise a heater for heating the reservoir 185 containing the heat transfer fluid. Alternatively, the heat transfer fluid can be cooled by a chiller 196 such as a refrigeration unit, condenser, or radiator. The amount of cooling provided by the heat exchanger 155 is sufficient to offset any excess heating of the ceiling 40 by the plasma, and the amount or heat provided by the heaters 150 and/or the in-line heater 190 Is sufficient to offset any cooling that occurs when the plasma is turned off. In a preferred embodiment, to facilitate rapid and responsive temperature control of the chamber surface, the heat exchanger 155 provides a means to cool the ceiling 40 at a constant cooling rate, while the maximum power of the heater 100 is selected to be able to overcome the cooling power of the heat exchanger 155. Preferably, the heat transfer fluid circulated in the heat exchanger 155 comprises a fluid having a high thermal conductivity, high electrical resistance, and low chemical reactivity to the materials of the heal exchanger and components of the recirculating system. Suitable fluids include high resistivity water, Freon®, and perfluorinated liquids such as Galden® or Fluorinert®.

Thermal contact between a surface of the chamber 25, such as the ceiling 40, and the heat exchanger 155 is maintained via the heat transfer member 158. Preferably, the heat transfer member 158 comprises a plurality of highly thermally conducting rings 200 having a lower heat conduction surface 205 thermally coupled to the chamber surface, and an upper heat transmitting surface 210 thermally coupled to the heat exchanger 155 to provide high heat transfer rates from the chamber surface to the heat exchanger 155. Preferably, the thermally conducting rings 200 increase the area of the ceiling 40 that is in thermal contact with the heat exchanger 155. The inductor antenna 125 is positioned around the lower portion of the heat transfer rings 200, so that a portion of the heat transfer rings extend through gaps in the inductor antenna. More preferably, the inductor antenna 125 is confined to the central region of the ceiling 40 to leave a large portion of the top surface of the chamber ceiling available for contacting and transferring heat by the heat transfer rings 200.

The dimensions of the heat transfer rings 200 are selected to maximize the available area of heat conduction and minimize absorption of RF energy from the inductor antenna 125 or other such powered components adjacent to the rings. For example, the height of the heat transfer rings 200 is selected so that the heat exchanger 155 is supported at a sufficient distance above the inductor antenna 125 to mitigate or eliminate the reduction in inductive coupling between the antenna and the plasma which would otherwise result from their close proximity to the conductive plane of the heat exchanger. Preferably, the height of the rings 200 above the inductor antenna 125 is a substantial fraction (e.g., ½) of the total height of the inductor antenna to displace the metal plate of the heat exchanger 155, well above the top of the inductor antenna. The width of the heat transfer rings 200 are selected to maximize the available cross-sectional area for heat conduction through the rings. A suitable set of heat transfer rings 200 comprises from 1 to 10 rings, more preferably 2 to 6 rings, and most preferably 4 rings. Each ring has a height of from about 2 to about 10 cm, and a width of from about 2 to about 6 cm. Preferably, the rings 200 are concentric to one another. For example, a set of four rings for a dome-shaped ceiling 40 having an inside diameter of from about 28 to about 38 cm, comprises an outer ring 200a having an outer diameter of from about 28 to about 36 cm, a second ring 200b having an outer diameter of from about 20 to about 25 cm, a third ring 200c having an outer diameter of from about 12 to about 18 cm, and the fourth or inner ring 200d having an outer diameter of from about 5 to about 8 cm. Instead of heat transfer rings, the heat transfer member 158 can also comprise a non-cylindrical cross-section, or a rectangular cross-section, having a shape and dimensions that maximize the available heat conduction area on the ceiling 40. For example, the heat transfer rings can comprise a triangular or conical cross-section, or form the base of the cone that is thermally coupled to the chamber surface.

Preferably, the heat transfer rings 200 are made from a material that has a high thermal conductivity to provide high thermal transfer rates, and that has a low electrical conductivity to avoid electrically unloading power from the inductor antenna 125. Suitable highly thermally conducting materials include ceramic materials such as aluminum nitride, aluminum oxide, silicon nitride, silicon carbide; or semi-conducting materials, such as silicon either lightly doped or undoped. More preferably, the rings 200 are concentric to one another with decreasing radii and are spaced apart a sufficient distance from one another to cover a large portion of the semiconductor ceiling 40. A suitable distance apart for the rings 200 is from about 1 to about 10 cms. Most preferably, the heat transfer rings 200 are sized to fit around the coils 128 of the inductor antenna 125 and provide spaces for fitting the radiant heat lamps 168 or sized to fit around any other chamber component such as the gas distributor 45 extending through the surface of the chamber 25.

In a preferred embodiment, the heat transfer member 158 preferably comprises silicon carbide material hot pressed or sintered to the desired shape. The density of the heat transfer rings 200 is preferably at least about 2.9 grams/cc, and the porosity is preferably less than about 2%. The thermal conductivity of the heat transfer rings 200 should be sufficiently high to provide high thermal transfer rates between the chamber surface and the heat exchanger 155. Preferably, the thermal conductivity of the heat transfer rings 200 throughout their thickness is at least about 80 watts/m-K, and more preferably at least about 100 watts/m-K, at a temperature of about 150 to 200° C. A further advantage of using silicon carbide for the heat transfer rings 200, for a chamber 25 comprising a silicon ceiling 40 is that the coefficient of thermal expansion of the silicon carbide approximates that of silicon. Preferably the coefficient of thermal expansion of the heat transfer rings 200 is about 4.81E-06/K, in a range of temperatures of from about 150 to about 200° C.

Preferably, the lower, surface 205 of the heat transfer rings 200 is bonded to a chamber surface, such as the ceiling 40, in such a way as to form a highly thermally conducting interface. In order to form a highly thermally conducting interface, it is necessary for the heat transfer rings 200 to uniformly contact the ceiling 40 across their entire lower surface 205; otherwise, high thermal transfer rates only occur at those portions that are in close thermal contact and low thermal transfer rates occur at areas with gaps or a roughened interface. The upper surface 210 and lower surfaces 205 of the heat transfer member 158 comprise a very smooth surface that provides uniform thermal coupling to the chamber surface. Preferably, the heat transfer member 158 comprises silicon carbide rings 200 having heat conduction or thermal transfer surfaces that are polished to provide surface having an rms peak-to-peak roughness of less than about 500 Å(50 nm), and more preferably less than 50 Å (5 nm). Preferably, the lower surface 205 of the heat transfer member 158 is bonded to the chamber surface with a thermally conducting adhesive having high thermal conductivity. The upper surface 210 of the heat transfer member 158 which serves as a thermal transfer or coupling surface, is also preferably bonded to the heat exchanger 155 using the thermally conducting adhesive. Suitable thermally conducting adhesives include polymeric or elastomeric materials, such as polyimide or epoxy adhesives, for example, a polyimide adhesive commercially available from AI Technologies, New Jersey. Other suitable thermally conducting adhesives comprise a mixture of silicone rubber impregnated with boron nitride.

The conventional temperature control system 145 controls the amount of current flow to the heaters 150, i.e., the heat lamps 168 or in-line heater 190, via a closed loop control system to maintain the temperature of the chamber surface at the desired predefined temperature. The temperature sensor 160 can comprise a thermocouple, RTD, or an optical pyrometer attached to or directed at the chamber surface. The radiant heater lamps 168 can be controlled together so that the entire chamber surface constitutes a single temperature controlled zone, or operated individually or in small groups of heaters that are circumferentially arranged at preselected radii from the center of the ceiling 40. In the latter embodiment, each radial group of heaters 150 is separately controlled from the other groups so that the ceiling 40 is divided into a plurality of annular zones in which temperatures can be adjusted to optimize processing uniformity.

The temperature control system 145 is operated by the computer control system 165 coupled to the temperature sensor 160. A suitable control system 145 comprises a computer program product that runs on a computer system comprising a central processor unit (CPU) interconnected to a memory system with peripheral control components, such as for example, a PENTIUM microprocessor, commercially available from Intel Corporation, Santa Clara, Calif. The program code is written in a conventional computer readable programming language, such as for example, assembly language C$^{++}$ or Pascal. Suitable program code is entered into a single file, or multiple files, using a conventional text editor and stored or embodied in a computer-usable medium, such as a memory system of the computer. If the entered code text is in a high level language, the code is compiled, and the resultant compiler code is linked with an object code of precompiled windows library routines. To execute the linked compiled object code, the system user invokes the object code, causing the computer system to load the code in memory to perform the tasks identified in the program. The interface between an operator and the computer system is typically a CRT monitor and a light pen. To select a particular screen or function, the operator touches a designated area of the display screen with the light pen and pushes the button on the pen. The area touched changes its color, or a new menu or screen is displayed, confirming the communication between the light pen and the display screen. Other devices, such as a keyboard, mouse, or pointing communication device can also be used instead of or in addition to the light pen to allow the user to communicate with the computer processor system.

The computer program typically comprises multiple routines of program code including a process sequencer routine for sequencing and timing operations in the apparatus 20, a manager routine for managing priorities of components in the apparatus, a process chamber routine for operating the process chamber 25, and a temperature control system routine for operating the temperature control system 145. While described as separate routines performing a set of tasks, it should be understood that each of these routines can be integrated with one another, or the tasks of one routine integrated with the tasks of another routine, to operate the desired set of tasks. Thus, the computer system and program described herein should not be limited to the specific embodiment of the functional routines described herein; and any other set of routines or merged program code that perform equivalent sets of functions are also in the scope of the present invention.

The temperature control system routine comprises a set of routines and program code to operate the temperature control system 145, including a heater routine and a heat exchanger routine. Typically, the temperature control system routine comprises program code for monitoring the various temperature control system components, determining which component needs to be operated based on the process parameters passed by the manager routine and operating the components in response to the monitoring and determining steps.

The heater routine comprises program code for operating the heaters 150 to heat the chamber surface in response to operator selected parameters and signals from the temperature sensors 160. The heater routine measures temperature by measuring voltage output of a thermocouple located in the chamber 25, compares the measured temperature to the set-point temperature, and increases or decreases current applied to the heaters 150 to obtain the desired surface temperature. The heater routines can also be embedded in a PID controller (not shown) that operates the heater 150.

The heat exchanger routine comprises program code for controlling the flow rate and temperature of fluid circulated in the channels 170 of the heat exchanger 155. The heat exchanger routine comprises a fluid distributor program code for adjusting the power to a recirculating pump and operating the fluid supply valve, according to an input signal from the temperature sensor 160. The heat exchanger routine; further comprises program code for controlling the in-line heater 190, or program code that operates the chiller 195 to cool the fluid in response to operator selected parameters and signals from system temperature sensors 160. The heat exchanger routine measures the fluid temperature by a thermocouple placed in the fluid reservoir 185 and increases or decreases current applied to the heater 150 to obtain the desired temperature. The temperature is determined by measuring the voltage across the thermocouple junction, and by looking up the corresponding temperature in a stored conversion table, or by calculating the temperature using a fourth order polynomial. The heat exchanger routine can use a proportional, integration, and differential (PID) controller solely dedicated to controlling the temperature of the heat exchanger 155 or can comprise a part of the computer program running on the computer system. A suitable PID controller comprises a single purpose controller having means for monitoring one or more temperature parameters, controlling power supplied to a heat exchanger pump, and means of calculating a parameter in a dynamic model.

In operation, the radiant heaters 150 are powered to rapidly ramp up the temperature of a surface of the process chamber 25. Thereafter, the temperature control system 145 regulates the temperature of the chamber surface by circulating fluid in the heat exchanger 155 at a predetermined temperature and controlling the flow rate and temperature of fluid in the heat exchanger 155. The fluid removes excess heat from the chamber surface 40 or adds heat, depending on the temperature difference between the fluid and the chamber surface, to control its temperature. The heat transfer member 158 transfers heat at high thermal transfer rates to and from the heat exchanger 155.

The temperature control system 145 described herein can be adapted to any semiconductor process chamber 25. For example, a CVD chamber used to deposit dielectric material by chemical vapor deposition, for example, as described in U.S. Pat. No. 5,500,249, issued Mar. 19, 1996,which is incorporated herein by reference. The temperature control system 145 can also be used to control the temperature of other chambers such as an epitaxial reactor, ion implantation chamber, or sputtering chamber as would be apparent to one of ordinary skill in the art.

Bonding & Assembly

The method of bonding the assembly of the chamber surface such as the silicon ceiling 40, to a heat transfer member 158 such as the annular heat transfer rings 200, to provide a highly thermally conducting bond will now be described. In this process, the semiconductor or silicon ceiling 40 is chemically cleaned prior to bonding to the heat transfer rings 200. A commercial degreasing solution such as Oakite is used to clean the silicon ceiling 40 for about ten minutes in an ultrasonic cleaner. Thereafter, the ceiling 40 is rinsed in distilled water and dried by a stream of dry nitrogen or clean dry filtered air. The silicon ceiling 40 is then immersed in HF solution at a concentration of 50:1 of distilled water to HF for about 3 to 4 minutes. Alternative cleaning solutions include mixtures of HF and $H_2O_2$, or other acidic mixtures of HCl, $H_2SO_4$, or $HNO_3$. Thereafter, the silicon ceiling 40 is removed from the acidic solutions and ultrasonically cleaned in distilled water for 2 to 15 minutes. Prior to assembly, the chamber ceiling 40, heat transfer member 158, and bonding jig fixture (as described below) were cleaned free of dust and contaminants using isopropanol.

Figure 4:
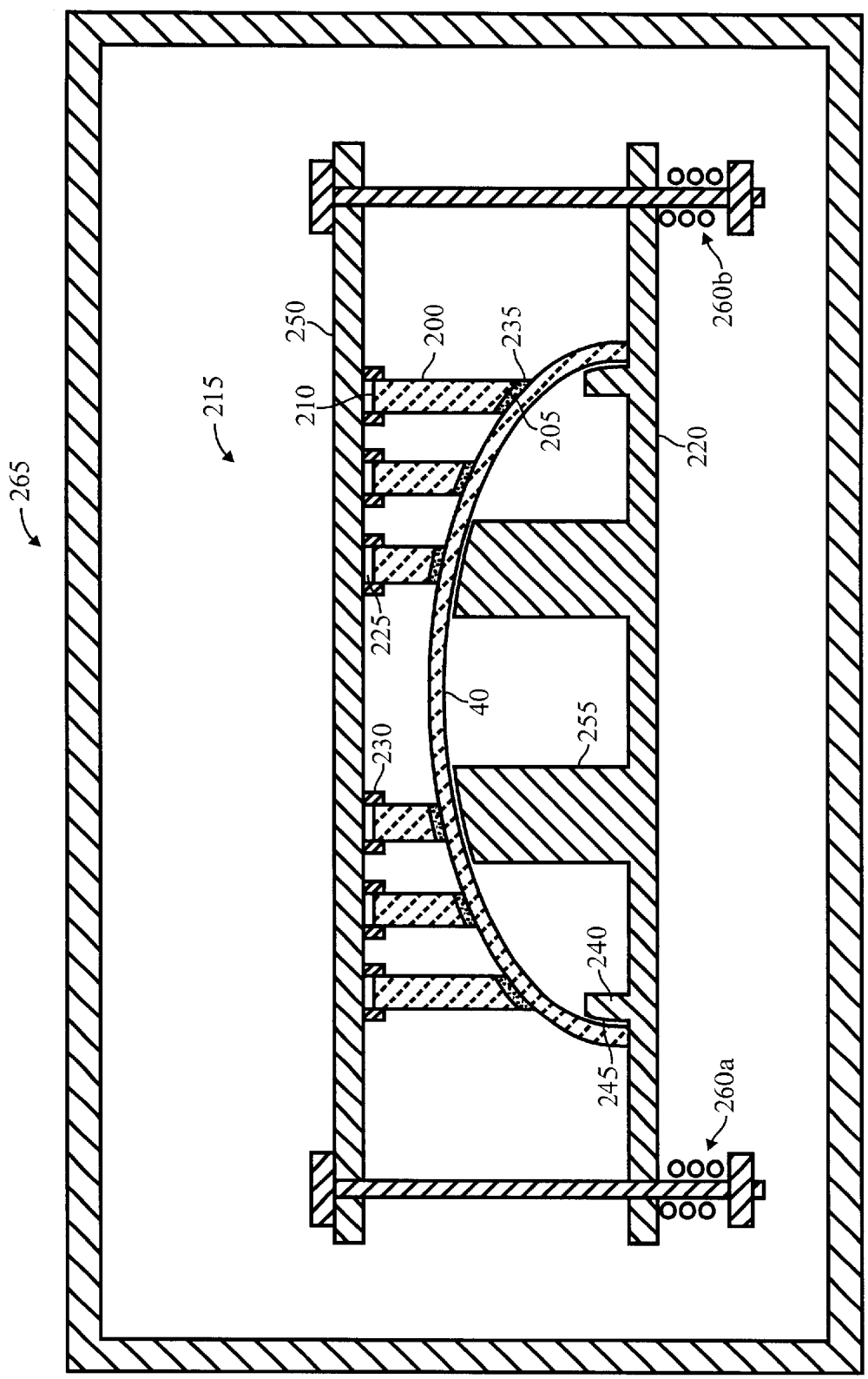
FIG. 4 is a schematic sectional side view of a jig holding apparatus for holding and bonding heat transfer rings to the chamber ceiling.

The heat transfer member 158 is bonded to the ceiling 40 using a bonding fixture jig 215, as shown in FIG. 4, that maintains the correct positional relationship between the different components and the surface of the go ceiling during assembly. The bonding fixture jig 215 comprises a flat plate 220 that is used to mount silicon carbide rings to the silicon ceiling 40. The surface of the flat plate 220 has a flatness with peak-to-peak rms of less than 125 microns (5 mils), and more preferably less than about 50 microns (2 mils). A thin release sheet 225, such as a Mylar™ sheet, is placed on the flat surface of the flat plate 220. Thereafter, the annular silicon carbide rings are placed on the release sheet 225 and aligned to one another using a set of dowel pins 230 that are positioned to guide the outer circumferential surface of the annular rings so that the rings are properly positioned relative to one another, as shown in FIGS. 3 and 4. Each of the dowel pins 230 are tapered to form a cone that does not break off or chip the brittle ceramic silicon carbide rings. The dowel pins 230 are made of a material having a hardness similar to, or less than, the hardness of the SiC ceramic rings to avoid damaging the rings during the alignment procedure. A suitable ceramic material for the dowel pins 230 comprises boron nitride or silicon nitride.

Thereafter, a cut-out adhesive preform layer 235 that comprises a temperature-sensitive adhesive is positioned over the bottom thermal coupling surfaces of the annular rings. The silicon ceiling 40 is placed on top of the preform adhesive layer 235. Three or more circumferentially positioned alignment posts 240 are located on the flat surface of the jig plate to align the silicon ceiling 40 to the silicon carbide annular rings 200. The alignment posts 240 have chamfered inner edges 245 that align the perimeter of the silicon ceiling 40 to the circumference of the silicon carbide rings 200. A flate plate 220 is positioned over the silicon ceiling 40. The pressure plate 250 has two or three upstanding posts 255 that rest on the inner surface of the silicon ceiling 40 to apply pressure against the silicon ceiling 40. A spring loaded nut and bolt assembly 260a, 260b extends through the jig plate and the pressure plate 250, as shown in FIG. 4, to securely clamp the assembly together. The spring assembly allows the silicon ceiling 40 and the annular heat transfer rings 200 to thermally expand without breakage during heat treatment.

The assembly of bonding fixture, ceiling 40, and heat transfer rings 200 aligned over the adhesive preform layer is placed in a temperature controlled oven 265 capable of reaching the 650° C. The temperature oven 265 is lined with a material that introduces little or no metallic contamination into the silicon ceiling 40, such as for example, ceramic fiber insulator of $SiO_2$, $Al_2O_3$, $ZrO_2$, or mixtures thereof. The temperature is ramped to about 325° C. in about 1 hour. The temperature is maintained for a temperature soak at 325° C. for about 2½ hours. Thereafter, the oven 265 is allowed to cool to room temperature, and the bonding assembly is disassembled to provide a chamber ceiling 40 with thermally coupled bonded heat transfer rings 200. After bonding, the die shear strength of the bonded rings and silicon ceiling 40 is typically from about 200 to about 600 psi.

The process chamber 25 and temperature control system 145, according to the present invention, provides uniform and constant temperatures across a process chamber surface. regardless of varying thermal loads and temperature fluctuations within the chamber. The temperature control system 145 is particularly advantageous for controlling the temperature of a chamber surfaces that have adjacent components such as inductor coils, heating or cooling elements, temperature measurement sensors 160, or process gas distributors. The temperature control system 145 of the present invention maintains a constant and uniform temperature across the chamber surface, provides low mechanical and thermal stresses on the chamber surface, and provides more reproducible and consistent substrate processing characteristics.

Although the present invention has been described in considerable detail with regard to the preferred versions thereof, other versions are possible, as apparent to one of ordinary skill in the art. For example, the heat transfer member 158 can have any other configuration, structure, or assembly of structures, suitable for conducting heat to or from a particular chamber surface without deviating from the scope of the present invention. Furthermore, upper, lower, center, ceiling, base, floor, and other such terms of spatial orientation or structures can be changed to equivalent or opposite orientations without affecting the scope of the present invention. Therefore, the appended claims should not be limited to the descriptions of the preferred versions, materials, or spatial arrangements described herein to illustrate the invention.

What is claimed is:

1. A substrate processing apparatus comprising:
   (a) a process chamber comprising a support, a process gas distributor, and an exhaust; and
   (b) a heat transfer member having a surface bonded to an external surface of the process chamber, wherein the heat transfer member is thermally coupled to one or more of (i) a heat exchanger member and (ii) a heater.

2. An apparatus according to claim 1 wherein the heat transfer member comprises a surface having an rms peak-to-peak roughness of less than about 500 angstroms.

3. An apparatus according to claim 2 wherein the surface of the heat transfer member is bonded to the external surface of the process chamber by a thermally conducting adhesive.

4. An apparatus according to claim 1 wherein the heat transfer member comprises silicon carbide, silicon nitride, or mixtures thereof.

5. An apparatus according to claim 1 further comprising an inductor antenna adjacent to the external surface of the process chamber.

6. An apparatus according to claim 5 wherein the inductor antenna abuts a ceiling of the process chamber, the ceiling comprising a material that is permeable to RF energy.

7. An apparatus according to claim 1 wherein the heat transfer member comprises a ring.

8. An apparatus according to claim 7 wherein the heat transfer member comprises from 2 to 6 rings.

9. An apparatus according to claim 1 wherein the heat transfer member is thermally coupled to a heat exchanger member adapted to cool the ceiling at a cooling rate and a heater adapted to provide a heating rate that is able to overcome the cooling rate of the heat exchanger.

10. An apparatus according to claim 1 wherein the heat exchanges member comprises channels or passages for flowing a heat transfer fluid therethrough.

11. An apparatus capable of processing a substrate in a plasma, the apparatus comprising:
    a) a process chamber comprising a support, a process gas distributor, an exhaust, and a ceiling comprising semiconductor material permeable to an RF induction field;
    (b) an inductor antenna adjacent to the ceiling to couple an RF induction field through the ceiling into the process chamber; and
    (c) a temperature control system comprising a heat exchanger, and a heat transfer member having a heat conduction surface bonded to the ceiling and a heat transmitting surface thermally coupled to the heat exchanger.

12. An apparatus according to claim 11 wherein the heat transfer member comprises a ring.

13. An apparatus is according to claim 11 further compromising a heater, wherein the heat exchanger is adapted to cool the ceiling at a cooling rate, and wherein the heat adapted to provide a heating rate that is able to overcome the cooling rate of the heat exchanger.

14. An apparatus according to claim 11 wherein the heat exchanger comprise channels or passages for flowing a heat transfer fluid therethrough.

15. A substrate processing apparatus comprising:
    (a) a process chamber comprising a substrate support, a process gas distributor, a plasma generator comprising an inductor antenna capable of coupling RF energy into the process chamber, and an exhaust; and
    (b) a heat transfer member having a heat conduction surface bonded to an external surface of the process chamber, wherein the heat transfer member extends at least partially through the inductor antenna.

16. An apparatus according to claim 15 wherein the heat transfer member comprises a heat conduction surface having an rms peak-to-peak roughness of less than about 500 angstroms.

17. An apparatus according to claim 15 wherein the heat conduction surface of the heat transfer member is bonded to the external surface of the process chamber by a thermally conducting adhesive.

18. An apparatus according to claim 15 wherein the heat transfer member is thermally coupled to a heat exchanger or a heater.

19. An apparatus according to claim 15 wherein the heat transfer member comprises silicon carbide, silicon nitride, or mixtures thereof.

20. An apparatus according to claim 15 wherein the heat transfer member comprises a ring.

21. An apparatus according to claim 20 wherein the heat transfer member comprises from 2 to 6 rings.

22. A substrate processing apparatus comprising:
    (a) a process chamber comprising a support, a process gas distributor, and an exhaust; and
    (b) a heat transfer member having a surface bonded to an external surface of the process chamber, wherein the heat transfer member comprises a surface having an rms peak-to-peak roughness of less than about 500 angstroms.

23. An apparatus according to claim 22 wherein the surface of the heat transfer member is bonded to the external surface of the process chamber by a thermally conducting adhesive.

24. An apparatus according to claim 22 wherein the heat transfer member comprises silicon carbide, silicon nitride, or mixtures thereof.

25. An apparatus according to claim 22 wherein the heat transfer member comprises a ring.

26. A substrate processing apparatus comprising:
    (a) a process chamber comprising a substrate support, a process gas distributor, a plasma generator, and an exhaust; and
    (b) a heat transfer member having a heat conduction surface bonded to an external surface of the process chamber, wherein the heat conduction surface of the heat transfer member is bonded to the external surface of the process chamber by a thermally conducting adhesive.

27. An apparatus according to claim 26 wherein the heat transfer member comprises silicon carbide, silicon nitride, or mixtures thereof.

28. An apparatus according to claim 26 wherein the heat transfer member comprises a ring.

29. An apparatus capable of processing a substrate in a plasma, the apparatus comprising:
    (a) a process chamber comprising a support, a process gas distributor, an exhaust, and a ceiling comprising a semiconductor material permeable to an RF induction field;

(b) an inductor antenna adjacent to the ceiling to couple an RF induction field through the ceiling into the process chamber; and (c) a temperature control system comprising a heat exchanger and a heat transfer member having (i) a heat conduction surface bonded to the ceiling, the heat conduction surface comprising an rms peak-to-peak roughness of less than about 500 angstroms, and (ii) a heat transmitting surface thermally coupled to the heat exchanger.

30. An apparatus according to claim 29 wherein the heat conduction surface of the heat transfer member is bonded to the ceiling by a thermally conducting adhesive.

31. An apparatus according to claim 29 wherein the heat transfer member comprises silicon carbide, silicon nitride, or mixtures thereof.

32. An apparatus according to claim 29 wherein the heat transfer member comprises a ring.

33. An apparatus according to claim 29 wherein the heat exchanger comprises channels or passages for flowing a heat transfer fluid therethrough.

34. An apparatus capable of processing a substrate in a plasma, the apparatus comprising:

(a) a process chamber comprising a support, a process gas distributor, an exhaust, and a ceiling comprising a semiconductor material permeable to an RF induction field;

(b) an inductor antenna adjacent to the ceiling to couple an RF induction field through the ceiling into the process chamber; and (c) a temperature control system comprising a heat exchanger and a heat transfer member having (i) a heat conduction surface bonded to the ceiling by a thermally conducting adhesive, and (ii) a heat transmitting surface thermally coupled to the heat exchanger.

35. An apparatus according to claim 34 wherein the heat transfer member comprises silicon carbide, silicon nitride, or mixtures thereof.

36. An apparatus according to claim 34 wherein the heat transfer member comprises a ring.

37. An apparatus according to claim 34 wherein the heat exchanger comprises channels or passages for flowing a heat transfer fluid therethrough.

38. An apparatus capable of processing a substrate in a plasma, the apparatus comprising:

(a) a process chamber comprising a support, a process gas distributor, an exhaust, and a ceiling comprising a semiconductor material permeable to an RF induction field;

(b) an inductor antenna adjacent to the ceiling to couple an RF induction field through the ceiling to a process gas in the process chamber; and (c) a temperature control system comprising a heat exchanger, and a heat transfer member (i) having a heat conduction surface bonded to the ceiling and a heat transmitting surface thermally coupled to the heat exchanger, and (ii) comprising silicon carbide, silicon nitride, or mixtures thereof.

39. An apparatus according to claim 38 wherein the heat transfer member comprises a ring.

40. An apparatus according to claim 38 wherein the heat exchanger comprises channels or passages for flowing a heat transfer fluid therethrough.

* * * * *